United States Patent
Chen

(10) Patent No.: US 12,506,494 B2
(45) Date of Patent: Dec. 23, 2025

(54) ZOOM ANALOG-TO-DIGITAL CONVERSION CIRCUIT AND ANALOG-TO-DIGITAL CONVERSION METHOD THEREOF

(71) Applicant: REALTEK SEMICONDUCTOR CORP., Hsinchu (TW)

(72) Inventor: Wen-Tze Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 170 days.

(21) Appl. No.: 18/444,055

(22) Filed: Feb. 16, 2024

(65) Prior Publication Data

US 2024/0291502 A1    Aug. 29, 2024

(30) Foreign Application Priority Data

Feb. 23, 2023  (TW) ................... 112106812

(51) Int. Cl.
*H03M 1/12*    (2006.01)
*H03M 3/00*    (2006.01)

(52) U.S. Cl.
CPC .................... *H03M 3/494* (2013.01)

(58) Field of Classification Search
CPC ...... H03M 1/468; H03M 3/426; H03M 1/164;
H03M 1/462; H03M 1/466; H03M
1/1245; H03M 1/46; H03M 3/46; H03M
1/0617; H03M 1/14; H03M 1/38; H03M
3/452; H03M 3/464; H03M 1/0604;
H03M 1/0626; H03M 1/1023; H03M
1/12; H03M 3/454; H03M 1/00; H03M
1/002; H03M 1/06; H03M 1/0695; H03M
1/0836; H03M 1/0854; H03M 1/1205;
H03M 1/1215; H03M 1/145; H03M
1/201; H03M 1/36; H03M 1/66; H03M
1/804; H03M 3/32; H03M 3/366; H03M
3/37; H03M 3/398;
(Continued)

(56) References Cited

U.S. PATENT DOCUMENTS 8,400,343 B1 *  3/2013 Lin .................. H03M 1/14
                                                341/172
9,143,153 B1 *  9/2015 Tai .................. H03M 1/164
(Continued)

OTHER PUBLICATIONS

Eland et al. "A 440 μW 109.8-dB DR 106.5-dB SNDR Discrete-Time Zoom ADC With a 20-KHz BW", IEEE Journal of Solid-State Circuits, 2021, Total p. 10.
(Continued)

*Primary Examiner* — Linh V Nguyen
(74) *Attorney, Agent, or Firm* — Birch, Stewart, Kolasch & Birch, LLP

(57) ABSTRACT

A zoom analog-to-digital conversion circuit includes a successive approximation register analog-to-digital converter (SAR ADC), a sigma-delta modulator, and a switch circuit. The SAR ADC includes a comparator and a dummy capacitor. A first connection terminal of the dummy capacitor is coupled to an input port of the comparator. The sigma-delta modulator includes an integrator, a quantizer, and an adder. The adder is coupled between the integrator and the quantizer. The switch circuit is configured to selectively couple a second connection terminal of the dummy capacitor to a common mode potential or the adder.

20 Claims, 5 Drawing Sheets

(58) Field of Classification Search
CPC ........ H03M 3/422; H03M 3/424; H03M 3/43;
H03M 3/448; H03M 3/45; H03M 3/47;
H03M 3/506; H03M 1/001; H03M 1/007;
H03M 1/0602; H03M 1/0607; H03M
1/0609; H03M 1/0624; H03M 1/0668;
H03M 1/0678; H03M 1/069; H03M 1/08;
H03M 1/10; H03M 1/1009; H03M
1/1038; H03M 1/1042; H03M 1/121;
H03M 1/123; H03M 1/125; H03M
1/1265; H03M 1/129; H03M 1/1295;
H03M 1/144; H03M 1/146; H03M 1/16;
H03M 1/162; H03M 1/18; H03M 1/181;
H03M 1/20; H03M 1/362; H03M 1/44;
H03M 1/464; H03M 1/50; H03M 1/502;
H03M 1/52; H03M 1/56; H03M 1/60;
H03M 1/664; H03M 1/742; H03M 1/80;
H03M 3/30; H03M 3/344; H03M 3/352;
H03M 3/394; H03M 3/406; H03M 3/41;
H03M 3/414; H03M 3/436; H03M 3/442;
H03M 3/494; H03M 3/50; H03M 7/3015;
H03M 7/3024; H03M 7/304
USPC ........ 341/155, 156, 161, 162, 172, 143, 163
See application file for complete search history.

(56) References Cited

U.S. PATENT DOCUMENTS

| | | | | |
|---|---|---|---|---|
| 9,197,240 | B1* | 11/2015 | Kinyua | H03M 1/0626 |
| 9,553,602 | B1* | 1/2017 | Wu | H03M 1/468 |
| 9,654,132 | B2* | 5/2017 | Venca | H04M 1/08 |
| 9,806,728 | B1* | 10/2017 | Sugimoto | H03M 1/0602 |
| 2021/0305990 | A1* | 9/2021 | Xu | H03F 3/45475 |
| 2023/0179211 | A1* | 6/2023 | Huang | H03M 1/066 |
| | | | | 341/118 |
| 2023/0179214 | A1* | 6/2023 | Kinyua | H03M 1/0854 |
| | | | | 341/118 |
| 2024/0137040 | A1* | 4/2024 | Sanyal | H03M 1/60 |
| 2024/0356559 | A1* | 10/2024 | Oh | H03M 1/462 |
| 2024/0356560 | A1* | 10/2024 | Tan | H03M 1/468 |

OTHER PUBLICATIONS

Karmakar et al. " A 280 µW Dynamic Zoom ADC With 120 dB DR and 118 dB SNDR in 1 KHz BW" IEEE Journal of Solid-State Circuits, vol. 53, No. 12; Dec. 2018, Total p. 13.

* cited by examiner

ZOOM ANALOG-TO-DIGITAL CONVERSION CIRCUIT AND ANALOG-TO-DIGITAL CONVERSION METHOD THEREOF

CROSS-REFERENCE TO RELATED APPLICATION

This non-provisional application claims priority under 35 U.S.C. § 119(a) to patent application Ser. No. 11/210,6812 filed in Taiwan, R.O.C. on Feb. 23, 2023, the entire contents of which are hereby incorporated by reference.

BACKGROUND

Technical Field

The present application relates to the technology of analog-to-digital conversion. In particular, the present application relates to a zoom analog-to-digital conversion circuit and an analog-to-digital conversion method.

Related Art

The zoom analog-to-digital conversion circuit incorporating a successive approximation register analog-to-digital converter (SAR ADC) and a sigma-delta modulator can be applied to audio applications. Generally, in the case that a signal transfer function (STF) of the zoom analog-to-digital conversion circuit is not 1, fuzz will appear in the frequency spectrum of the zoom analog-to-digital conversion circuit.

In a traditional practice, a residual value for feedforward is generated in a manner by replicating the capacitors in the SAR ADC, such that the STF of the zoom analog-to-digital conversion circuit can be 1 to improve the fuzz issue. However, the traditional practice suffers from the capacitance mismatch problems occurring between replica digital-to-analog converters (DACs) (i.e., the capacitors in the SAR ADC) and between the replica DACs and replica inputs. Furthermore, in order to solve the capacitance mismatch problem, in the traditional practice, the capacitance of the capacitors will be increased, thereby increasing the required layout area and power consumption.

SUMMARY

In an embodiment, the present application provides a zoom analog-to-digital conversion circuit. The zoom analog-to-digital conversion circuit includes a successive approximation register analog-to-digital converter (SAR ADC), a sigma-delta modulator, and a switch circuit. The SAR ADC includes a comparator and a dummy capacitor. The comparator has an input port. The dummy capacitor has a first connection terminal and a second connection terminal. The first connection terminal of the dummy capacitor is coupled to the input port of the comparator. The sigma-delta modulator includes an integrator, a quantizer, and an adder. The adder is coupled between the integrator and the quantizer. The switch circuit is coupled to the second connection terminal of the dummy capacitor. The switch circuit is configured to selectively couple the second connection terminal of the dummy capacitor to a common mode potential or the adder of the sigma-delta modulator.

In an embodiment, the present application provides an analog-to-digital conversion method for a zoom analog-to-digital conversion circuit. In this embodiment, the zoom analog-to-digital conversion circuit includes a SAR ADC and a sigma-delta modulator. The analog-to-digital conversion method includes: performing an analog-to-digital conversion on a first analog input signal by the SAR ADC to generate a first digital signal and a residue signal, wherein the SAR ADC comprises a dummy capacitor and a comparator, and wherein during a process of the analog-to-digital conversion, a first connection terminal of the dummy capacitor is coupled to an input port of the comparator, and a second connection terminal of the dummy capacitor is coupled to a common mode potential; switching the second connection terminal of the dummy capacitor from being coupled to the common mode potential to being coupled to an adder of the sigma-delta modulator; feeding forward the residue signal to the adder through the dummy capacitor; and generating a digital output signal by the sigma-delta modulator according to the first analog input signal, the first digital signal, and the residue signal.

To sum up, according to the zoom analog-to-digital conversion circuit and the analog-to-digital conversion method of one or some embodiments of the present application, a feedforward period is added after the SAR ADC completes the sampling and the conversion, and the residue signal of the SAR ADC is fed forward through the dummy capacitor and the switch circuit to the adder of the sigma-delta modulator during the feedforward period. Therefore, the signal transfer function (STF) of the zoom analog-to-digital conversion circuit can ideally be 1 to effectively improve the fuzz issue. Furthermore, according to one or some embodiments of the present application, the dummy capacitor can be implemented by using a dummy capacitor that has been configured in the SAR ADC to greatly reduce the layout area of the zoom analog-to-digital conversion circuit. Compared with the manner that generates the residual value by replicating the capacitors in the SAR ADC, the zoom analog-to-digital conversion circuit and the analog-to-digital conversion method according to one or some embodiments of the present application does not have the capacitance mismatch problem, and the power consumption will not increase.

Detailed features and advantages of the present application are described in detail in the following implementations, and the content of the implementations is sufficient for a person skilled in the art to understand and implement the technical content of the present application. A person skilled in the art can easily understand the objectives and advantages related to the present application according to the contents disclosed in this specification, the claims and the drawings.

DETAILED DESCRIPTION

To make the objectives, features, and advantages of the embodiments of the present application more comprehensible, the following provides detailed descriptions with reference to the accompanying drawings.

It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
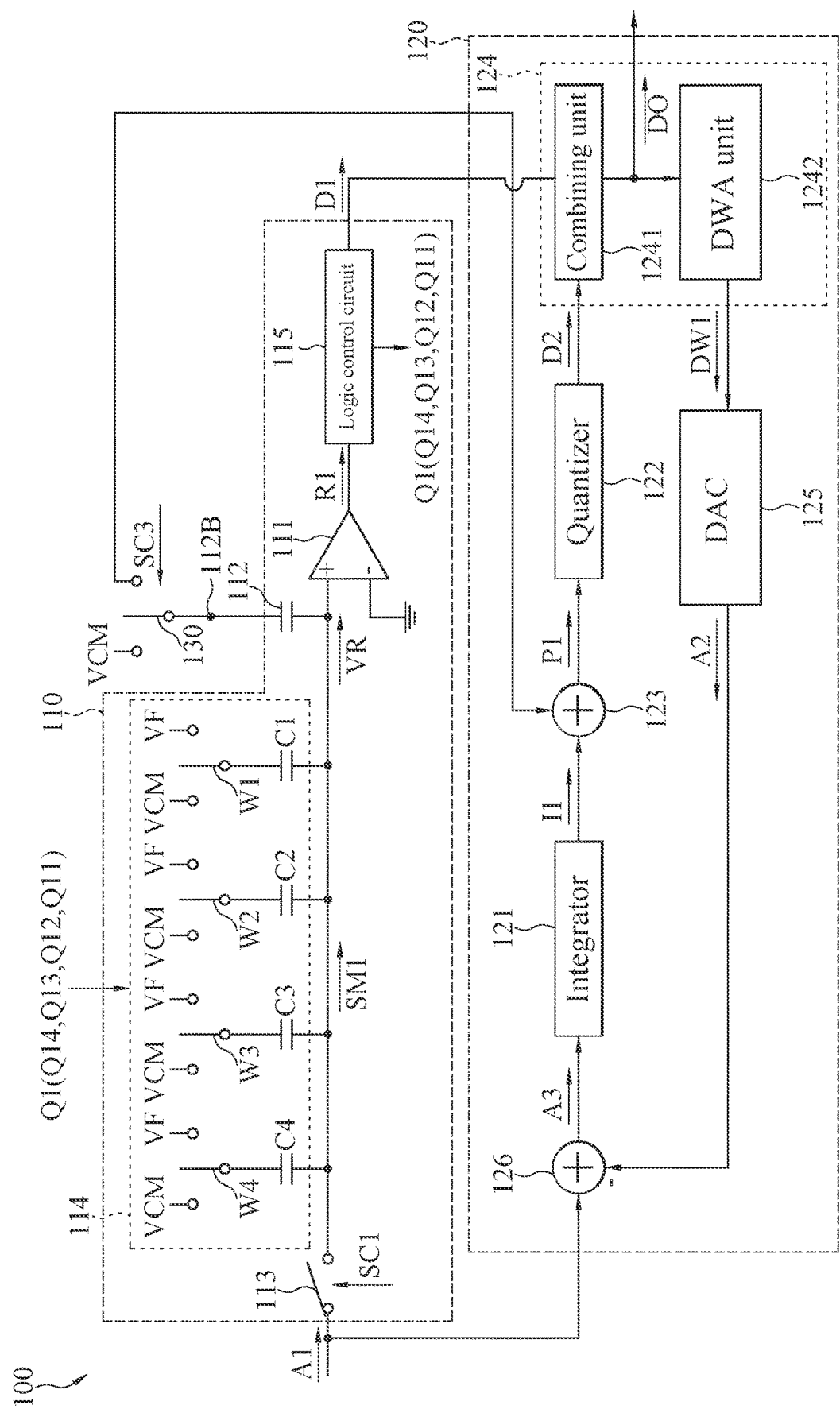
FIG. 1 illustrates a schematic view of a zoom analog-to-digital conversion circuit according to an embodiment of the present application.
Figure 2:
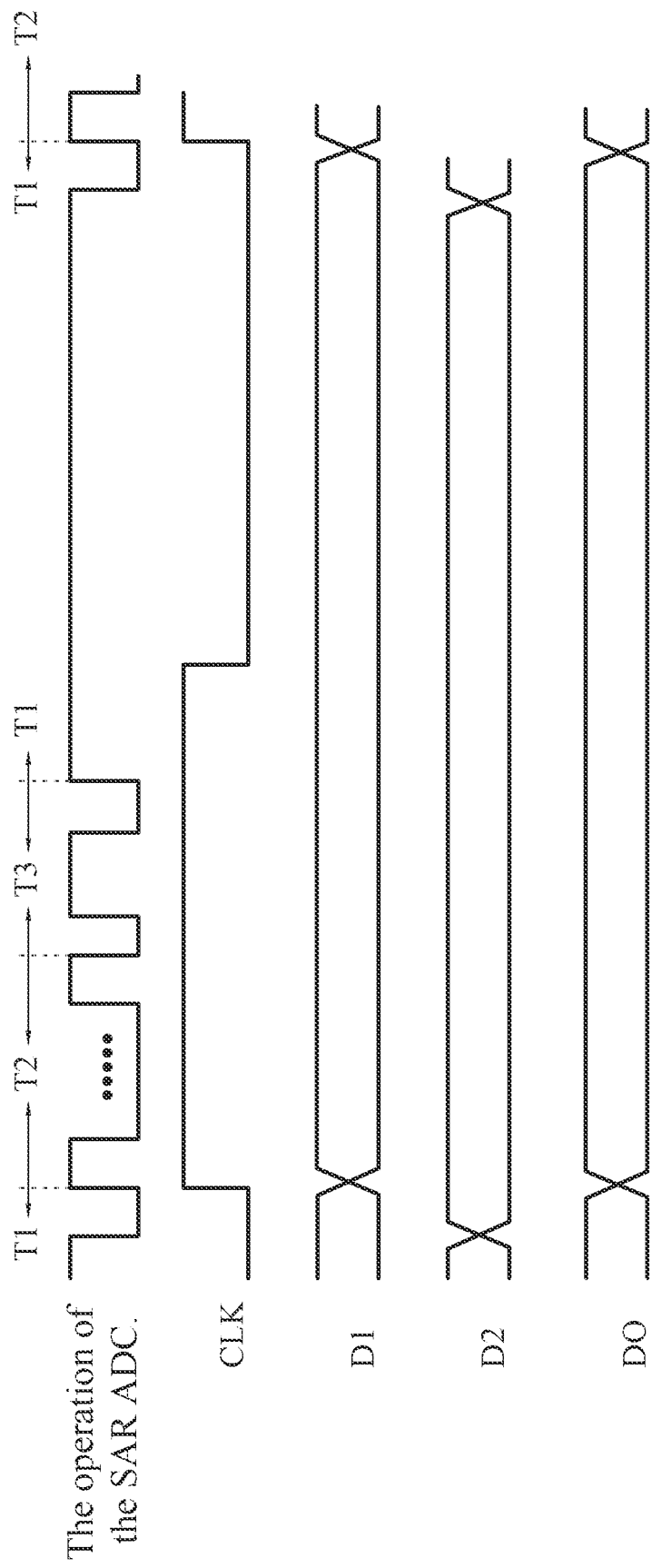
FIG. 2 illustrates a schematic diagram showing a timing of a zoom analog-to-digital conversion circuit according to an embodiment of the present application.

FIG. 1 illustrates a schematic view of a zoom analog-to-digital conversion circuit 100 according to an embodiment of the present application. FIG. 2 illustrates a schematic diagram showing a timing of the zoom analog-to-digital conversion circuit 100 according to an embodiment of the present application. Please refer to FIG. 1 and FIG. 2. The zoom analog-to-digital conversion circuit 100 can receive a first analog input signal A1 provided by a front-end circuit (not shown), and the zoom analog-to-digital conversion circuit 100 converts the first analog input signal A1 into a digital output signal DO according to an analog-to-digital conversion method according to any embodiments of the present disclosure.

In some embodiments, the zoom analog-to-digital conversion circuit 100 operates according to a clock signal CLK. In some implementations, a duty cycle of the clock signal CLK is 50%.

In some embodiments, the zoom analog-to-digital conversion circuit 100 includes a successive approximation register analog-to-digital converter (SAR ADC) 110, a sigma-delta modulator 120, and a switch circuit 130. The sigma-delta modulator 120 is coupled to the SAR ADC 110, and the switch circuit 130 is coupled to the SAR ADC 110 and the sigma-delta modulator 120.

An input port of the SAR ADC 110 is coupled to the front-end circuit (not shown) to receive the first analog input signal A1 from the front-end circuit. The SAR ADC 110 is configured to perform an analog-to-digital conversion on the first analog input signal A1 to generate a first digital signal D1 and output the first digital signal D1.

In some embodiments, the SAR ADC 110 includes a comparator 111 and a dummy capacitor 112. Furthermore, The SAR ADC 110 may further include an input switch 113, a capacitor array 114, and a logic control circuit 115. In this embodiment, the input switch 113, the capacitor array 114, the dummy capacitor 112, and the comparator 111 are sequentially coupled to each other (e.g., connected in series) between the front-end circuit (not shown) and the logic control circuit 115.

The following illustrates the present application in a single-ended input type of the SAR ADC 110, but the present application is not limited thereto. The SAR ADC 110 may also be a dual-ended input type SAR ADC. A person skilled in the art can understand how to convert the single-ended input type into the dual-ended input type.

A first terminal of the input switch 113 is coupled to the front-end circuit (not shown) to receive the first analog input signal A1 from the front-end circuit. A second terminal of the input switch 113 is coupled to the capacitor array 114. A control terminal of the input switch 113 is coupled to a control circuit (not shown) to receive a control signal SC1 from the control circuit. The input switch 113 is configured to determine whether to transmit the first analog input signal A1 to the capacitor array 114 according to the control signal SC1.

The capacitor array 114 is coupled to the second terminal of the input switch 113, an input port of the comparator 111, and a first connection terminal of the dummy capacitor 112.

In this embodiment, the capacitor array 114 is coupled to a positive input terminal of the input port of the comparator 111. A control terminal of the capacitor array 114 is coupled to an output terminal of the logic control circuit 115 to receive a logic signal Q1 from the logic control circuit 115. The capacitor array 114 is configured to sample the first analog input signal A1 to obtain a sampling signal SM1, and the capacitor array 114 is also configured to adjust the sampling signal SM1 into a residue signal VR according to the logic signal Q1.

In some embodiments, the capacitor array 114 may include a plurality of capacitor modules C4-C1 and a plurality of switch modules W4-W1, and the capacitor modules C4-C1 correspond to the switch modules W4-W1 in a one-to-one relationship. The switch modules W4-W1 may respectively correspond to one of the bits Q14-Q11 of the logic signal Q1. Furthermore, the capacitor modules C4-C1 can respectively and sequentially correspond to the highest bit to the lowest bit of the first digital signal D1.

The following takes the four capacitor modules C4-C1 and the four switch modules W4-W1 as an example, but the numbers of the capacitor module and the switch module are not limited thereto. A first terminal of each of the capacitor modules C4-C1 is coupled to the positive input terminal of the comparator 111 and the second terminal of the input switch 113. A second terminal of each of the capacitor modules C4-C1 is coupled to the first terminal of a corresponding one of the switch modules W4-W1. Second terminals of the switch modules W4-W1 are respectively coupled to one of a plurality of potential levels, for example, one of a reference potential VF and a common mode potential VCM, or one of the reference potential VF, the common mode potential VCM, and floating. The switch modules W4-W1 may respectively correspond to and be sequentially controlled by the highest bit to the lowest bit of the logic signal Q1. Specifically, in this embodiment, the control terminals of the switch modules W4-W1 are coupled to the logic control circuit 115 to respectively receive the corresponding bit of the bits Q14-Q11 of the logic signal Q1. In the case that the capacitor array 114 samples the first analog input signal A1 (as a sampling period T1 shown in FIG. 2), the second terminals of the switch modules W4-W1 are coupled to the common mode potential VCM, such that the capacitor modules C4-C1 sample the first analog input signal A1 to obtain the sampling signal SM1. In the case that the capacitor array 114 converts the sampling signal SM1 (as a conversion period T2 shown in FIG. 2), the switch modules W4-W1 respectively perform, according to the corresponding bits Q14-Q11 of the logic signal Q1, a switching on the potential levels coupled to the second terminals of the switch modules W4-W1, such that the capacitor modules C4-C1 convert the sampling signal SM1 into the residue signal VR.

The positive input terminal of the comparator 111 receives the residue signal VR from the capacitor 114. A negative input terminal of the input port of the comparator 111 may be coupled to a reference potential. In some implementations, the reference potential may be a virtual ground potential, such as an alternating current (AC) ground potential, or a common mode potential VCM. The comparator 111 can generate a comparison result R1 by comparing the residue signal VR on the positive input terminal with the reference potential on the negative input terminal.

An input terminal of the logic control circuit 115 is coupled to an output terminal of the comparator 111 to receive the comparison result R1 from the comparator 111. The logic control circuit 115 is configured to generate, according to the comparison result R1 of the comparator 111, the first digital signal D1 and the logic signal Q1, and the logic control circuit 115 is also configured to output the logic signal Q1 to the switch modules W4-W1 of the capacitor array 114 to sequentially control the switching of the switch modules W4-W1 by using the bits Q14-Q11 of the logic signal Q1.

A first terminal of the switch circuit 130 is coupled to a second connection terminal 112B of the dummy capacitor 112. A second terminal of the switch circuit 130 is coupled to the common mode potential VCM. A third terminal of the switch circuit 130 is coupled to the sigma-delta modulator 120. A control terminal of the switch circuit 130 is coupled to a control circuit (not shown) to receive a control signal SC3 from the control circuit. The switch circuit 130 is configured to selectively establish, according to the control signal SC3, a connection path between the first terminal of the switch circuit 130 and the second terminal of the switch circuit 130 or a connection path between the first terminal of the switch circuit 130 and the third terminal of the switch circuit 130, such that the second connection terminal 112B of the dummy capacitor 112 may be selectively coupled to the common mode potential VCM or the sigma-delta modulator 120.

In some embodiments, as shown in FIG. 2, each operation cycle of the SAR ADC 110 includes a sampling period T1, a conversion period T2, and a feedforward period T3 in sequence. Since the conversion period T2 is much smaller than the pulse width of the clock signal CLK (e.g., less than about 0.05 times the pulse width of the clock signal CLK), the present application does not need to pay much circuit cost for the added feedforward period T3.

During the sampling period T1, the input switch 113 is turned on according to the control signal SC1 to transmit the first analog input signal A1 to the capacitor array 114, and the capacitor array 114 performs a sampling on the first analog input signal A1 (through the input switch 113) to generate the sampling signal SM1. Furthermore, the switch circuit 130 establishes the connection path between the first terminal of the switch circuit 130 and the second terminal of the switch circuit 130 according to the control signal SC3, such that the second connection terminal 112B of the dummy capacitor 112 is coupled to the common mode potential VCM.

Next, during the conversion period T2, the input switch 113 is disabled (e.g., disconnected) according to the control signal SC1. The capacitor array 114 is switched according to the logic signal Q1 to convert the sampling signal SM1 into the residue signal VR. The comparator 111 generates the comparison result R1 according to the residue signal VR. The logic control circuit 115 generates the first digital signal D1 and the logic signal Q1 according to the comparison result R1. Furthermore, the switch circuit 130 keeps establishing the connection path between the first terminal of the switch circuit 130 and the second terminal of the switch circuit 130. In other words, in this embodiment, the second connection terminal 112B of the dummy capacitor 112 is still coupled to the common mode potential VCM in this period.

Afterward, during the feedforward period T3, the switch circuit 130 switches to establish the connection path between the first terminal of the switch circuit 130 and the third terminal of the switch circuit 130 according to the control signal SC3, such that the second connection terminal 112B of the dummy capacitor 112 is switched to be coupled to the sigma-delta modulator 120. In this period, the residue signal VR on the input port of the comparator 111 can be extracted through the dummy capacitor 112 and the switch circuit 130, and the residue signal VR is then fed forward to the sigma-delta modulator 120. Through the residue signal VR which is fed forward to the sigma-delta modulator 120, a signal transfer function (STF) can ideally be 1, thereby effectively improving the fuzz issue.

In some embodiments, the dummy capacitor 112 may be implemented by a dummy capacitor that has been configured in the SAR ADC 110. In this case, since it is not necessarily needed to have an additional circuit for extracting the residue signal VR, the layout area of the zoom analog-to-digital conversion circuit 100 can be reduced greatly. In some implementations, the capacitance value of the dummy capacitor 112 may be the same as the capacitance value of the capacitor module C1 in the capacitor array 114. For example, the capacitance value of the dummy capacitor 112 is the unit capacitance, but the capacitance value of the dummy capacitor 112 is not limited thereto. The capacitance value of the dummy capacitor 112 can be designed according to a required feedforward gain.

In some embodiments, the sigma-delta modulator 120 includes an integrator 121, a quantizer 122, and an adder 123, and the adder 123 is coupled between the integrator 121 and the quantizer 122. Furthermore, the sigma-delta modulator 120 may further include a digital control module 124, a digital-to-analog converter (DAC) 125, and a subtractor 126.

An input terminal of the DAC 125 is coupled to the output terminal of the digital control module 124 to receive a data weighted averaging (DWA) signal DW1 from the digital control module 124. The DAC 125 is configured to generate a second analog input signal A2 according to the DWA signal DW1. In this embodiment, the second analog input signal A2 is an analog feedback signal, and the bit number of the DAC 125 is related to the bit number of the second analog input signal A2.

One of two input terminals of the subtractor 126 is coupled to the front-end circuit (not shown) to receive the first analog input signal A1 from the front-end circuit. The other input terminal of the subtractor 126 is coupled to an output terminal of the DAC 125 to receive the second analog input signal A2 from the DAC 125. The subtractor 126 is configured to perform a subtraction operation according to the first analog input signal A1 and the second analog input signal A2 (e.g., subtracting the second analog input signal A2 from the first analog input signal A1) to generate a third analog input signal A3.

An input terminal of the integrator 121 is coupled to an output terminal of the subtractor 126 to receive the third analog input signal A3 from the subtractor 126. The integrator 121 is configured to perform an integral operation according to the third analog input signal A3 to generate an integral signal I1. The integrator 121 may also be regarded as a loop filter, for example, a low-pass filter (LPF).

One input terminal of the adder 123 is coupled to an output terminal of the integrator 121 to receive the integral signal I1 from the integrator 121. The other input terminal of the adder 123 is coupled to the third terminal of the switch circuit 130 to receive the residue signal VR which is fed forward through the dummy capacitor 112 and the switch circuit 130. The adder 123 is configured to perform an addition operation according to the integral signal I1 and the residue signal VR to generate an addition signal P1.

An input terminal of the quantizer 122 is coupled to an output terminal of the adder 123 to receive the addition signal P1. The quantizer 122 is configured to perform a quantization operation according to the addition signal P1 to generate a second digital signal D2. In some implementations, the order of the quantizer 122 and the bit number of the second digital signal D2 can be designed correspondingly according to the needs of the circuit.

One input terminal of the digital control module 124 is coupled to an output terminal of the logic control circuit 115 of the SAR ADC 110 to receive the first digital signal D1 from the logic control circuit 115. The other input terminal of the digital control module 124 is coupled to an output terminal of the quantizer 122 to receive the second digital signal D2 from the quantizer 122. The digital control module 124 is configured to generate the DWA signal DW1 and the digital output signal DO according to the first digital signal D1 and the second digital signal D2.

In some embodiments, the digital control module 124 may include a combining unit 1241 and a data weighted averaging (DWA) unit 1242.

One input terminal of the combining unit 1241 is coupled to the output terminal of the logic control circuit 115 of the SAR ADC 110 to receive the first digital signal D1 from the logic control circuit 115. The other input terminal of the combining unit 1241 is coupled to the output terminal of quantizer 122 to receive the second digital signal D2 from the quantizer 122. The combining unit 1241 is configured to combine the first digital signal D1 and the second digital signal D2 into the digital output signal DO. In some implementations, the bit number of the digital output signal DO is the same as the bit number of the first digital signal D1.

An input terminal of the DWA unit 1242 is coupled to an output terminal of the combining unit 1241 to receive the digital output signal DO from the combining unit 1241. The DWA unit 1242 is configured to perform a data weighted averaging (DWA) algorithm on the digital output signal DO to generate the DWA signal DW1 and to output the DWA signal DW1 to the DAC 125.

Figure 3:
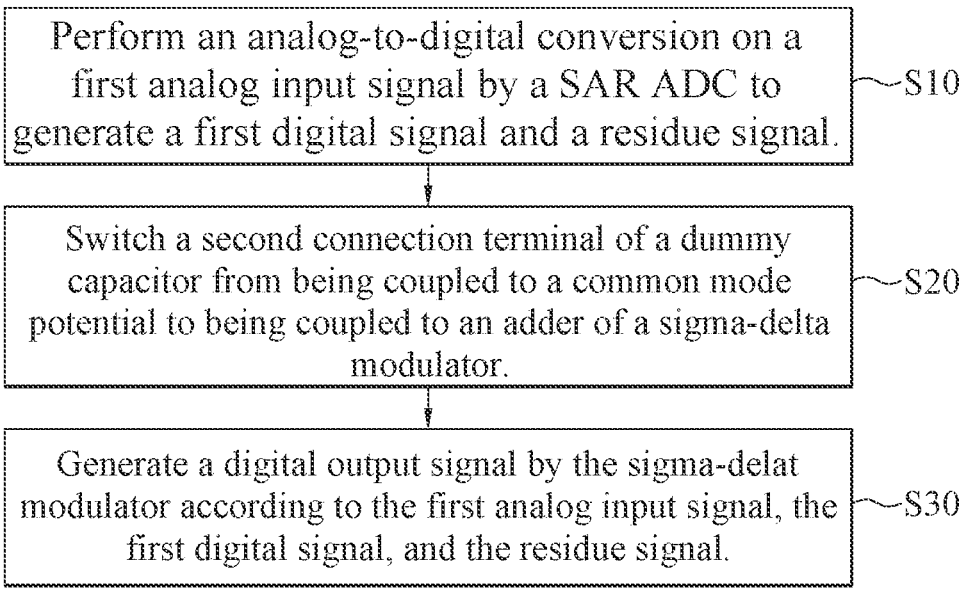
FIG. 3 illustrates a schematic flow chart of an analog-to-digital conversion method according to an embodiment of the present application.

FIG. 3 illustrates a schematic flow chart of the analog-to-digital conversion method according to an embodiment of the present application. Please refer to FIG. 1 to FIG. 3. In an embodiment of the analog-to-digital conversion method, the zoom analog-to-digital conversion circuit 100 performs an analog-to-digital conversion on a first analog input signal A1 by the SAR ADC 110 to generate a first digital signal D1 and a residue signal VR (step S10).

Figure 4:
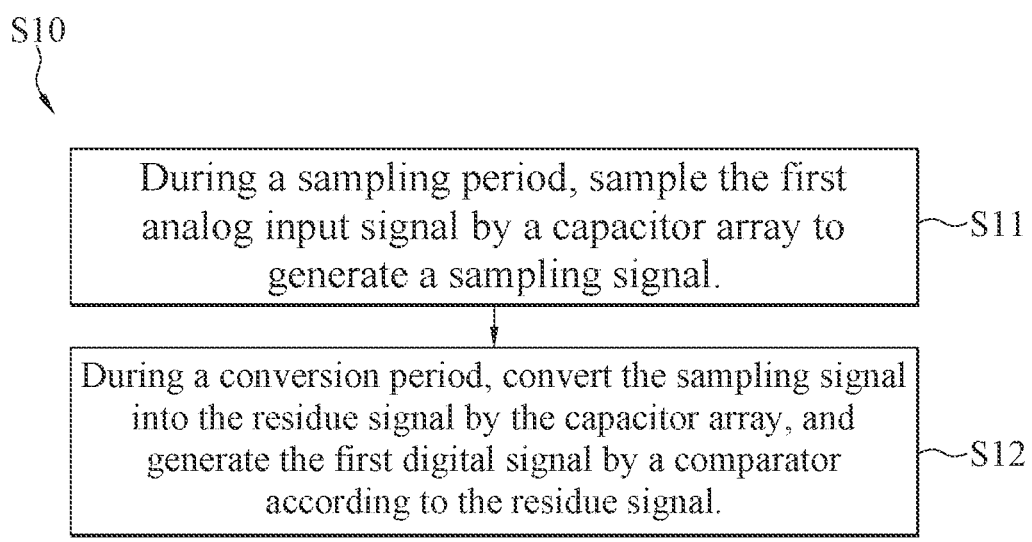
FIG. 4 illustrates a schematic flow chart of the step S10 according to an embodiment of the present application.

FIG. 4 illustrates a schematic flow chart of the step S10 according to an embodiment of the present application. Please refer to FIG. 1 to FIG. 4. In an embodiment of the step S10, during the sampling period T1, the input switch 113 is turned on by the control signal SC1 to transmit the first analog input signal A1 to the capacitor array 114. The second terminals of the capacitor modules C4-C1 of the capacitor array 114 may be coupled to the common mode potential VCM through the switch modules W4-W1, and the capacitor array 114 samples the first analog input signal A1 through the capacitor modules C4-C1 to obtain the sampling signal SM1 (step S11). Furthermore, the switch circuit 130 establishes, according to the control signal SC3, the connection path between the first terminal of the switch circuit 130 and the second terminal of the switch circuit 130, such that the second connection terminal 112B of the dummy capacitor 112 is coupled to the common mode potential VCM. After the capacitor array 114 completes the sampling, the SAR ADC 110 enters the conversion period T2. During the conversion period T2, the input switch 113 is turned off by the control signal SC1 to disconnect the electrical connection between the first analog input signal A1 and the capacitor array 114. The capacitor array 114 performs, according to the logic signal Q1, a switching on the potential levels of the capacitor modules C4-C1 to convert the sampling signal SM1 into the residue signal VR with a corresponding ratio. The comparator 111 generates the comparison result R1 according to the residue signal VR. The logic control circuit 115 generates the first digital signal D1 and the logic signal Q1 according to the comparison result R1 (step S12). Furthermore, the switch circuit 130 keeps coupling the second connection terminal 112B of the dummy capacitor 112 to the common mode potential VCM according to the control signal SC3.

Next, the SAR ADC 110 enters the feedforward period T3 after the conversion is completed. During the feedforward period T3, the switch circuit 130 switches to establish the connection path between the first terminal of the switch circuit 130 and the third terminal of the switch circuit 130, such that the second connection terminal 112B of the dummy capacitor 112 is changed from being coupled to the common mode potential VCM to being coupled to the adder 123 of the sigma-delta modulator 120. In this period, the residue signal VR on the input port of the comparator 111 can be extracted through the dummy capacitor 112 and the switch circuit 130, and the residue signal VR can be fed forward to the adder 123 (step S20).

In some embodiments, the total time spent on performing the step S10 and the step S20 is an operation cycle (the sampling period T1, the conversion period T2, and the feedforward period T3) of the SAR ADC 110.

After the sigma-delta modulator 120 receives the residue signal VR which is fed forward, the sigma-delta modulator 120 can generate the digital output signal DO according to the first analog input signal A1, the first digital signal D1, and the residue signal VR.

Figure 5:
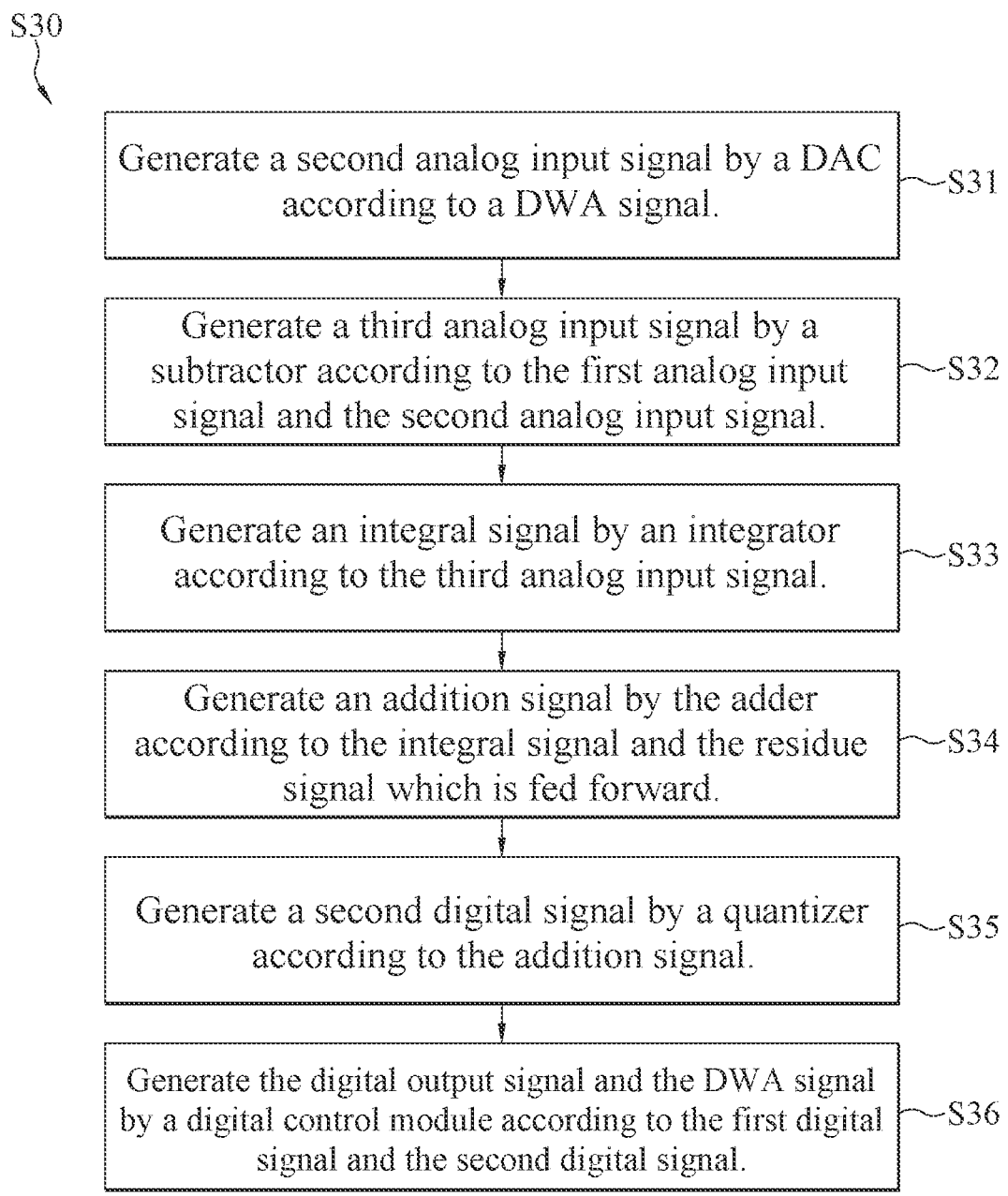
FIG. 5 illustrates a schematic flow chart of the step S30 according to an embodiment of the present application.

FIG. 5 illustrates a schematic flow chart of the step S30 according to an embodiment of the present application. Please refer to FIG. 1 to FIG. 5. In an embodiment of the step S30, the sigma-delta modulator 120 generates the second analog input signal A2 by the DAC 125 according to the DWA signal DW1 from the digital control module 124 (step S31), and the sigma-delta modulator 120 performs the subtraction operation by the subtractor 126 according to the first analog input signal A1 from the front-end circuit (not shown) and the second analog input signal A2 from the DAC 125 to generate the third analog input signal A3 (step S32). The sigma-delta modulator 120 performs the integral operation on the third analog input signal A3 by the integrator 121 to generate the integral signal I1 (step S33), and the sigma-delta modulator 120 performs the addition operation by the adder 123 according to the integral signal I1 from the integrator 121 and the residue signal VR which is fed forward from the SAR ADC 110 to generate the addition signal P1 (step S34). Afterward, the sigma-delta modulator 120 performs the quantization operation by the quantizer 122 according to the addition signal P1 from the adder 123 to generate the second digital signal D2 (step S35), and the sigma-delta modulator 120 generates the DWA signal DW1 and the digital output signal DO by the digital control module 124 according to the second digital signal D2 from the quantizer 122 and the first digital signal D1 from the SAR ADC 110 (step S36).

Figure 6:
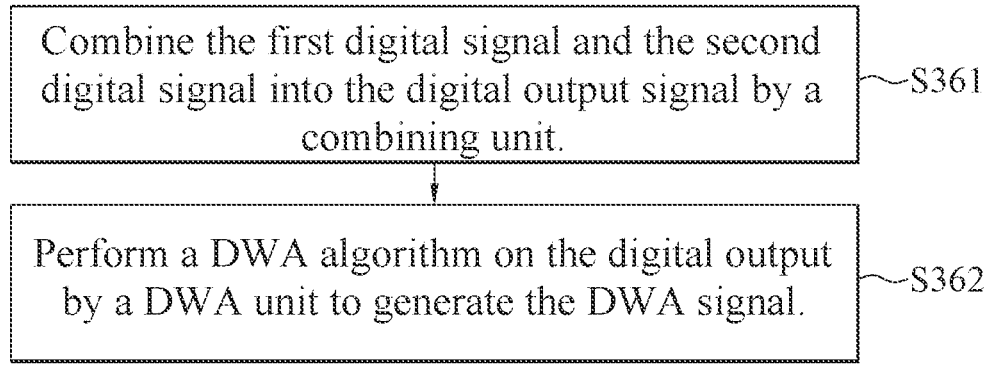
FIG. 6 illustrates a schematic flow chart of the step S36 according to an embodiment of the present application.

FIG. 6 illustrates a schematic flow chart of the step S36 according to an embodiment of the present application. Please refer to FIG. 1 to FIG. 6. In an embodiment of the step S36, the digital control module 124 combines the first digital signal D1 and the second digital signal D2 into the digital output signal DO by the combining unit 1241 (step S361), and the digital control module 124 performs the DWA algorithm on the digital output signal DO by the DWA unit

1242 to generate the DWA signal DW1 and outputs the DWA signal DW1 by the DWA unit 1242.

To sum up, according to the zoom analog-to-digital conversion circuit 100 and the analog-to-digital conversion method of one or some embodiments of the present application, a feedforward period T3 is added after the SAR ADC 110 completes the sampling and the conversion, and the residue signal VR of the SAR ADC 110 is fed forward through the dummy capacitor 112 and the switch circuit 130 to the adder 123 of the sigma-delta modulator 120 during the feedforward period T3. Therefore, the signal transfer function (STF) of the zoom analog-to-digital conversion circuit 100 can ideally be 1 to effectively improve the fuzz issue. Furthermore, according to one or some embodiments of the present application, the dummy capacitor 112 can be implemented by using a dummy capacitor that has been configured in the SAR ADC 110 to greatly reduce the layout area of the zoom analog-to-digital conversion circuit 100. Compared with the manner that generates the residual value by replicating the capacitors in the SAR ADC, the zoom analog-to-digital conversion circuit 100 and the analog-to-digital conversion method according to one or some embodiments of the present application does not have the capacitance mismatch problem, and the power consumption will not increase.

Although the present application has been described in considerable detail with reference to certain preferred embodiments thereof, the disclosure is not for limiting the scope of the application. Persons having ordinary skill in the art may make various modifications and changes without departing from the scope and spirit of the present application. Therefore, the scope of the appended claims should not be limited to the description of the preferred embodiments described above.

What is claimed is:

1. A zoom analog-to-digital conversion circuit, comprising:
    a successive approximation register analog-to-digital converter (SAR ADC) comprising:
        a comparator having an input port; and
        a dummy capacitor having a first connection terminal and a second connection terminal, wherein the first connection terminal is coupled to the input port of the comparator;
    a sigma-delta modulator comprising:
        an integrator;
        a quantizer; and
        an adder coupled between the integrator and the quantizer; and
    a switch circuit coupled to the second connection terminal of the dummy capacitor, wherein the switch circuit is configured to selectively couple the second connection terminal of the dummy capacitor to a common mode potential or the adder of the sigma-delta modulator.

2. The zoom analog-to-digital conversion circuit according to claim 1, wherein an operation cycle of the SAR ADC comprises a conversion period and a feedforward period following the conversion period, the SAR ADC further comprises a capacitor array, and the capacitor array is coupled to the input port of the comparator; wherein during the conversion period, the switch circuit couples the second connection terminal of the dummy capacitor to the common mode potential, and the capacitor array is configured to generate a residue signal at the input port of the comparator according to a sampling signal; and wherein during the feedforward period, the switch circuit couples the second connection terminal of the dummy capacitor to the adder of the sigma-delta modulator to feed forward the residue signal to the adder through the dummy capacitor and the switch circuit.

3. The zoom analog-to-digital conversion circuit according to claim 2, wherein the capacitor array comprises:
    a plurality of capacitor modules, wherein a first terminal of each of the plurality of capacitor modules is coupled to the input port of the comparator; and
    a plurality of switch modules, wherein a plurality of first terminals of the plurality of switch modules are coupled to a plurality of second terminals of the plurality of capacitor modules, respectively, a plurality of second terminals of the plurality of switch modules are respectively coupled to one of a plurality of potential levels, and the plurality of switch modules correspond to a plurality of bits of a logic signal, respectively;
    wherein the plurality of switch modules switch the plurality of potential levels coupled to the plurality of second terminals of the plurality of switch modules according to the plurality of bits corresponding to the plurality of switch modules, such that the plurality of capacitor modules convert the sampling signal into the residue signal.

4. The zoom analog-to-digital conversion circuit according to claim 3, wherein the comparator is configured to generate a comparison result according to the residue signal and a reference potential, and the SAR ADC further comprises:
    a logic control circuit configured to generate a first digital signal and the logic signal according to the comparison result.

5. The zoom analog-to-digital conversion circuit according to claim 3, wherein a capacitance value of the dummy capacitor is the same as a capacitance value of one of the plurality of capacitor modules.

6. The zoom analog-to-digital conversion circuit according to claim 2, wherein the operation cycle further comprises a sampling period before the conversion period; and wherein during the sampling period, the capacitor array is configured to generate the sampling signal according to a first analog input signal, and the switch circuit couples the second connection terminal of the dummy capacitor to the common mode potential.

7. The zoom analog-to-digital conversion circuit according to claim 6, wherein the SAR ADC further comprises:
    an input switch, wherein the capacitor array samples the first analog input signal through the input switch to generate the sampling signal.

8. The zoom analog-to-digital conversion circuit according to claim 1, wherein the SAR ADC is configured to generate a first digital signal according to a first analog input signal, and the sigma-delta modulator further comprises:
    a digital control module configured to generate a digital output signal and a data weighted averaging (DWA) signal according to the first digital signal and a second digital signal;
    a digital-to-analog converter (DAC) configured to generate a second analog input signal according to the DWA signal; and
    a subtractor configured to generate a third analog input signal according to the first analog input signal and the second analog input signal;
    wherein the integrator is configured to generate an integral signal according to the third analog input signal, the adder is configured to generate an addition signal according to the integral signal and a residue signal which is fed forward through the dummy capacitor and the switch circuit, and the quantizer is configured to generate the second digital signal according to the addition signal.

9. The zoom analog-to-digital conversion circuit according to claim 8, wherein the digital control module comprises:
a combining unit configured to combine the first digital signal and the second digital signal into the digital output signal; and
a DWA unit configured to perform a DWA algorithm on the digital output signal to generate the DWA signal.

10. The zoom analog-to-digital conversion circuit according to claim 8, wherein a number of bits of the digital output signal is the same as a number of bits of the first digital signal.

11. An analog-to-digital conversion method for a zoom analog-to-digital conversion circuit, wherein the zoom analog-to-digital conversion circuit comprises a successive approximation register analog-to-digital converter (SAR ADC) and a sigma-delta modulator, and the analog-to-digital conversion method comprises:
performing an analog-to-digital conversion on a first analog input signal by the SAR ADC to generate a first digital signal and a residue signal, wherein the SAR ADC comprises a dummy capacitor and a comparator, and wherein during a process of the analog-to-digital conversion, a first connection terminal of the dummy capacitor is coupled to an input port of the comparator, and a second connection terminal of the dummy capacitor is coupled to a common mode potential;
switching the second connection terminal of the dummy capacitor from being coupled to the common mode potential to being coupled to an adder of the sigma-delta modulator;
feeding forward the residue signal to the adder through the dummy capacitor; and
generating a digital output signal by the sigma-delta modulator according to the first analog input signal, the first digital signal, and the residue signal.

12. The analog-to-digital conversion method according to claim 11, wherein an operation cycle of the SAR ADC comprises a sampling period and a conversion period following the sampling period, and the step of performing the analog-to-digital conversion on the first analog input signal by the SAR ADC to generate the first digital signal and the residue signal comprises:
during the sampling period, sampling the first analog input signal by a capacitor array of the SAR ADC to generate a sampling signal; and
during the conversion period, generating the residue signal by the capacitor array according to the sampling signal, and generating the first digital signal by the comparator according to the residue signal.

13. The analog-to-digital conversion method according to claim 12, wherein the step of sampling the first analog input signal by the capacitor array of the SAR ADC to generate the sampling signal comprises:
turning on an input switch of the SAR ADC; and
sampling the first analog input signal through the input switch by the capacitor to generate the sampling signal.

14. The analog-to-digital conversion method according to claim 12, wherein the step of generating the residue signal by the capacitor array according to the sampling signal comprises:
switching a plurality of switch modules of the capacitor array according to a logic signal, such that a plurality of capacitor modules convert the sampling signal into the residue signal according to a switching result of the plurality of switch modules.

15. The analog-to-digital conversion method according to claim 14, wherein the step of generating the first digital signal by the comparator according to the residue signal comprises:
generating a comparison result by the comparator according to the residue signal and a reference potential; and
generating the first digital signal and the logic signal by a logic control circuit of the SAR ADC according to the comparison result.

16. The analog-to-digital conversion method according to claim 14, wherein a capacitance value of the dummy capacitor is the same as a capacitance value of one of the plurality of capacitor modules.

17. The analog-to-digital conversion method according to claim 12, wherein the operation cycle further comprises a feedforward period following the conversion period; and wherein the step of switching the second connection terminal of the dummy capacitor from being coupled to the common mode potential to being coupled to the adder of the sigma-delta modulator and the step of feeding forward the residue signal to the adder through the dummy capacitor are performed in the feedforward period.

18. The analog-to-digital conversion method according to claim 11, wherein the step of generating the digital output signal by the sigma-delta modulator according to the first analog input signal, the first digital signal, and the residue signal comprises:
generating a second analog input signal by a digital-to-analog converter (DAC) of the sigma-delta modulator according to a data weighted averaging (DWA) signal;
generating a third analog input signal by a subtractor of the sigma-delta modulator according to the first analog input signal and the second analog input signal;
generating an integral signal by an integrator of the sigma-delta modulator according to the third analog input signal;
generating an addition signal by the adder of the sigma-delta modulator according to the residue signal and the integral signal;
generating a second digital signal by a quantizer of the sigma-delta modulator according to the addition signal; and
generating the digital output signal and the DWA signal by a digital control module of the sigma-delta modulator according to the first digital signal and the second digital signal.

19. The analog-to-digital conversion method according to claim 18, wherein the step of generating the digital output signal and the DWA signal by the digital control module of the sigma-delta modulator according to the first digital signal and the second digital signal comprises:
combining the first digital signal and the second digital signal into the digital output signal by the digital control module; and
performing a DWA algorithm on the digital output signal by the digital control module to generate the DWA signal.

20. The analog-to-digital conversion method according to claim 11, wherein a number of bits of the digital output signal is the same as a number of bits of the first digital signal.

* * * * *